(12) United States Patent
Nii

(10) Patent No.: US 6,741,492 B2
(45) Date of Patent: May 25, 2004

(54) SEMICONDUCTOR MEMORY DEVICE

(75) Inventor: Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 19 days.

(21) Appl. No.: 10/274,064

(22) Filed: Oct. 21, 2002

(65) Prior Publication Data

US 2003/0179600 A1 Sep. 25, 2003

(30) Foreign Application Priority Data

Mar. 19, 2002 (JP) ........................................ 2002-076446

(51) Int. Cl.[7] .............................................. G11C 11/40
(52) U.S. Cl. ...................................................... 365/154
(58) Field of Search ................................. 365/154, 156, 365/206

(56) References Cited

U.S. PATENT DOCUMENTS

| | | | | |
|---|---|---|---|---|
| 4,768,172 A | * | 8/1988 | Sasaki | ................... 365/230.05 |
| 5,338,963 A | | 8/1994 | Klaasen et al. | .............. 257/376 |
| 5,949,706 A | * | 9/1999 | Chang et al. | ................ 365/156 |
| 6,404,670 B2 | * | 6/2002 | Shau | .......................... 365/154 |
| 6,535,453 B2 | * | 3/2003 | Nii et al. | ................ 365/230.05 |

FOREIGN PATENT DOCUMENTS

| | | |
|---|---|---|
| JP | 8-235866 | 9/1996 |
| JP | 9-270468 | 10/1997 |
| JP | 10-92181 | 4/1998 |
| JP | 10-289854 | 10/1998 |
| JP | 2000-36543 | 2/2000 |
| JP | 2000-322889 | 11/2000 |

\* cited by examiner

*Primary Examiner*—Tan T. Nguyen
(74) *Attorney, Agent, or Firm*—McDermott, Will & Emery

(57) ABSTRACT

In a semiconductor memory device of the present invention, four access transistors of two memory cells arranged adjacent to each other in the same row are formed within a common p-type well, and each gate of access transistors of memory cell and each gate of access transistors and of memory cell are electrically connected to different word lines. Thereby, it is possible to obtain a semiconductor memory device capable of reducing generation of multi-bit errors.

6 Claims, 15 Drawing Sheets

SEMICONDUCTOR MEMORY DEVICE

BACKGROUND OF THE INVENTION

1. Field of the Invention

The present invention is directed to an improvement a soft error resistance property of a CMOS (Complementary Metal Oxide Semiconductor) static RAM Random Access Memory), and more particularly relates to a semiconductor memory device capable of avoiding a problem with fatal multi-bit errors.

2. Description of the Background Art

FIG. 14 is an equivalent circuit diagram of a general SRAM memory cell and shows two-bit memory cells MC0 and MC1 arranged adjacent to each other in a row direction. In reference to FIG. 14, first, memory cell MC0, as a one-bit memory cell circuit, will be described. Memory cell MC0 has two driver transistors N1A and N2A, two access transistors N3A and N4A, and two load transistors P1A and P2A. Two driver transistors N1A and N2A and two access transistors N3A and N4A are formed of nMOS transistors while two load transistors P1A and P2A are formed of pMOS transistors.

A first inverter is formed of nMOS transistor N1A and pMOS transistor P1A while a second inverter is formed of nMOS transistor N2A and pMOS transistor P2A. One output terminal of the first and second inverters are connected to another input terminals of the second and first inverters, respectively, thereby storage nodes ma and /ma are formed.

A source, a gate and a drain of nMOS transistor N3A are connected to one memory terminal ma, a word line WL and one bit line BLA, respectively. A source, a gate and a drain of nMOS transistor N4A are connected to the other memory terminal/ma, word line WL and the other bit line/BLA, respectively.

With the above described connection, the SRAM memory cell circuit is formed. Memory cell MC1 also has approximately the same configuration as that of the above described memory cell MC0.

Then, respective gates of respective access transistors N3A, N4A, N3B and N4B of the plurality of memory cells MC0 and MC1, which are aligned in the same row, are connected to common word line WL. Thereby, the memory cells aligned in the same row are simultaneously accessed when word line WL is risen.

A plan view layout configuration of such an SRAM memory cell is disclosed in, for example, Japanese Patent Laying-Open No. 9-270468.

FIG. 15 is a schematic plan view showing a layout configuration of the conventional SRAM memory cell shown in the above described publication using two-bit memory cells MC0 and MC1 arranged adjacent to each other in the row direction. In reference to FIG. 15, each of memory cells MC0 and MC1 is formed on surfaces of an n-type well 102 and of a p-type well 103 formed on a surface of a semiconductor substrate. According to description of memory cell MC0, two nMOS transistors N1A and N2A, which become a pair of driver transistors, and two nMOS transistors N3A and N4A, which become a pair of access transistors, are formed within p-type well 103. Two pMOS transistors P1A and P2A, which become a pair of load transistors, are formed within n-type well 102.

Driver transistors N1A and N2A have drains formed of n-type impurity regions $105a_2$, sources formed of n-type impurity regions $105a_3$ and gates 107c and 107b extending onto the regions between these drains and sources, respectively. Access transistors N3A and N4A have drains formed of n-type impurity regions $105a_1$, sources formed of n-type impurity regions $105a_2$ and gates 107a extending onto the regions between these drains and sources, respectively.

Source $105a_2$ of access transistor N3A and drain $105a_2$ of driver transistor N1A are formed of a common n-type impurity region. In addition, source $105a_2$ of access transistor N4A and drain $105a_2$ of driver transistor N2A are formed of a common n-type impurity region. Respective gates 105a of access transistors N3A and N4A are integrated with a single word line.

Load transistors P1A and P2A are formed of drains formed of p-type impurity regions $105b_1$, sources formed of p-type impurity regions $105b_2$ and gates 107c and 107b extending onto the regions between these drains and sources, respectively. Gate 107c of load transistor P1A and gate 107c of driver transistor N1A are formed of the common conductive layer while gate 107b of load transistor P2A and gate 107b of driver transistor N2A are formed of the common conductive layer.

Drain $105a_2$ of driver transistor N2A, drain $105b_1$ of load transistor P2A and respective gates 107c of load transistor P1A and driver transistor N1A are electrically connected by means of a conductive layer 112. Drain $105a_2$ of driver transistor N1A, drain $105b_1$ of load transistor P1A and respective gates 107b of load transistor P2A and driver transistor N2A are electrically connected by means of a conductive layer 112.

In addition, conductive layer 112 which is electrically connected to source $105a_3$ of driver transistor N2A and conductive layer 112 which is electrically connected to source $105a_3$ of driver transistor N1A are electrically connected by means of a conductive layer 114 serving as a GND potential. In addition, both source $105b_2$ of load transistor P1A and source $105b_2$ of load transistor P2A are electrically connected to conductive layer 114 serving as a VDD potential. In addition, drain $105a_1$ of access transistor N3A is electrically connected to bit line BL while drain $105a_1$ of access transistors N4A is electrically connected to bit line/ BL.

Memory cell MC1 has approximately the same configuration as that of the above described memory cell MC0.

Driver transistors N1A and N2A and access transistors N3A and N4A of this memory cell MC0 as well as driver transistors N1B and N2B and access transistors N3B and N4B of memory cell MC1 are formed within common p-type well 103. In addition, respective drains $105b_1$ and respective sources $105b_2$ of load transistors P1A and P2A of memory cell MC0 as well as respective drains $105b_1$ and respective sources $105b_2$ of load transistors P1B and P2B of memory cell MC1 are formed within common n-type well 102.

As the memory cells are miniaturized, a problem with a soft error, that data hold in a storage node is inverted due to electrons generated by α rays emitted from a package or due to neutron rays from space, becomes evident. In particular, this malfunction becomes evident as the power supply voltage is lowered.

One of the causes that invert the data hold in a storage node is the collection of a large number of electron hole pairs generated within a well by α rays or neutron rays in an impurity region forming a storage node, changing the potential thereof. Electrons from among electron hole pairs generated within a p-type well are collected in an n-type impurity region within the same p-type well, thereby the potential of this n-type impurity region tends be lowered. In addition, holes among electron hole pairs generated within an n-type well are collected in a p-type impurity region within the same n-type well, thereby the potential of this p-type impurity region tends be raised. In the case that this p-type impurity region or n-type impurity region is a memory node, a so-called soft error generates, which the hold data is inverted by change in potential due to the collected electrons or holes.

In order to avoid the above described problem with soft errors, a variety of measures such that a capacitor is attached to a memory node so as to make it difficult to be inverted have been carried out up to the present. However, as miniaturization has progressed, the lowering of voltage has progressed and the capacitance of a memory node has become increasingly smaller. Therefore, circumstances have become such that an increase in area in order to attach a capacitor so as to prevent inversion cannot be avoided. For example, the capacitance of a memory node of an SRAM memory cell in the 0.18 μm generation is approximately 2 fF so that the amount of charge collected in a memory node due to the application of one shot of α rays is as large as approximately several fC. Therefore, in the case that the power supply voltage is 1.8 V, electron hole pairs sufficient for generating a capacitance corresponding to 10 fF are generated. Thereby, it is understood that the data of the memory node is easily inverted. In addition, the number of electron hole pairs generated by the application of neutrons is ten times or more that from the application of α rays and, therefore, the addition of a slight amount of capacitance is no longer said to be effective for neutron rays.

A soft error has become a problem as described above and, on the other hand, a measure for nullification of the effect on the entire system, even in the case that a soft effort is generated, has been implemented by adding an error correction circuit (ECC circuit). Normally, the general case is wherein a redundancy code is added so that two-bit error detection and one-bit error correction are possible. Circuit configuration becomes very complicated when an error correction of more than that is attempted to be carried out and this is undesirable because circuit scale is significantly increased.

In the case that this ECC circuit for allowing one-bit error correction is provided, a one-bit soft error is automatically corrected when it generates and, therefore, the system is not affected. In the case that an error of two bits or more has generated, however, system reset is triggered when the generation of a two-bit error is detected. In a case where a multi-bit error has generated in such a manner, there is a problem that error correction becomes difficult so that it becomes a fatal error for the entirety of the system.

In the conventional memory cell configuration shown in FIG. 15, n-type well 102 and p-type well 103 are shared between memory cells adjoining each other. As miniaturization progresses, the distance between respective bits is reduced so that electron hole pairs generated within a well due to α rays or neutron rays are collected in impurity regions of a plurality of bit cells arranged adjacent to each other, thereby the possibility of simultaneously causing errors has increased. In particular, electrons have a higher mobility in comparison with holes and, therefore, exert a greater influence than do holes. Thus, in the case that the two-bit data arranged adjacent to each other is inverted due to a soft error and the data is simultaneously accessed, a problem arises, which the above described multi-bit error is generated and this becomes a fatal error for the entirety of the system.

SUMMARY OF THE INVENTION

An object of the present invention is to provide a semiconductor memory device capable of preventing generation of a multi-bit error.

A semiconductor memory device of the present invention is a semiconductor memory device which has a memory cell array including a plurality of memory cells arranged in a row direction and in a column direction and which is provided with a semiconductor substrate, a first conductive type region and a second conductive type region, and first and second word lines. The semiconductor substrate has a main surface. The first conductive type region and the second conductive type region extend in the column direction while arranged adjacent to each other in the main surface of the semiconductor substrate. The first and second word lines are arranged in the plurality of rows, respectively. Each of first and second memory cells arranged adjacent to each other among the plurality of memory cells arranged so as to be aligned in the same row has first and second access transistors. The first and second access transistors of the first memory cell and the first and second access transistors of the second memory cell are formed within the same first conductive type region. Each gate of the first and second access transistors of the first memory cell is electrically connected to the first word line while each gate of the first and second access transistors of the second memory cell is electrically connected to the second word line.

According to the semiconductor memory device of the present invention, since the access transistor of the first memory cell and the access transistor of the second memory cell are connected to different word lines, it is possible to make the first and second word lines to be simultaneously risen by corresponding the first and second word lines to different addresses. Thereby, two-bit memory cells, which are arranged adjacent to each other, sharing a region of the first conductive type can be prevented from being simultaneously accessed, thereby the generation of a multi-bit error can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described in reference to the drawings.
First Embodiment In reference to FIG. 1, the present embodiment differs from the conventional equivalent circuit (FIG. 14) in the point that memory cells MC0 and MC1 are connected to different word lines WLA and WLB so that memory cells MC0 and MC1 are not simultaneously selected in the present embodiment. That is to say, in the present embodiment, each gate of access transistors N3A and N4A of memory cell MC0 is connected to word line WLA and each gate of access transistors N3B and N4B of memory cell MC1 is connected to word line WLB.

This first word line WLA and the second word line WLB correspond to different addresses. Thus, memory cells MC0 and MC1 arranged adjacent to each other are connected to different word lines WLA and WLB, thereby the pair of memory cells MC0 and MC1 arranged adjacent to each other in the same row are not simultaneously accessed.

Figure 14:
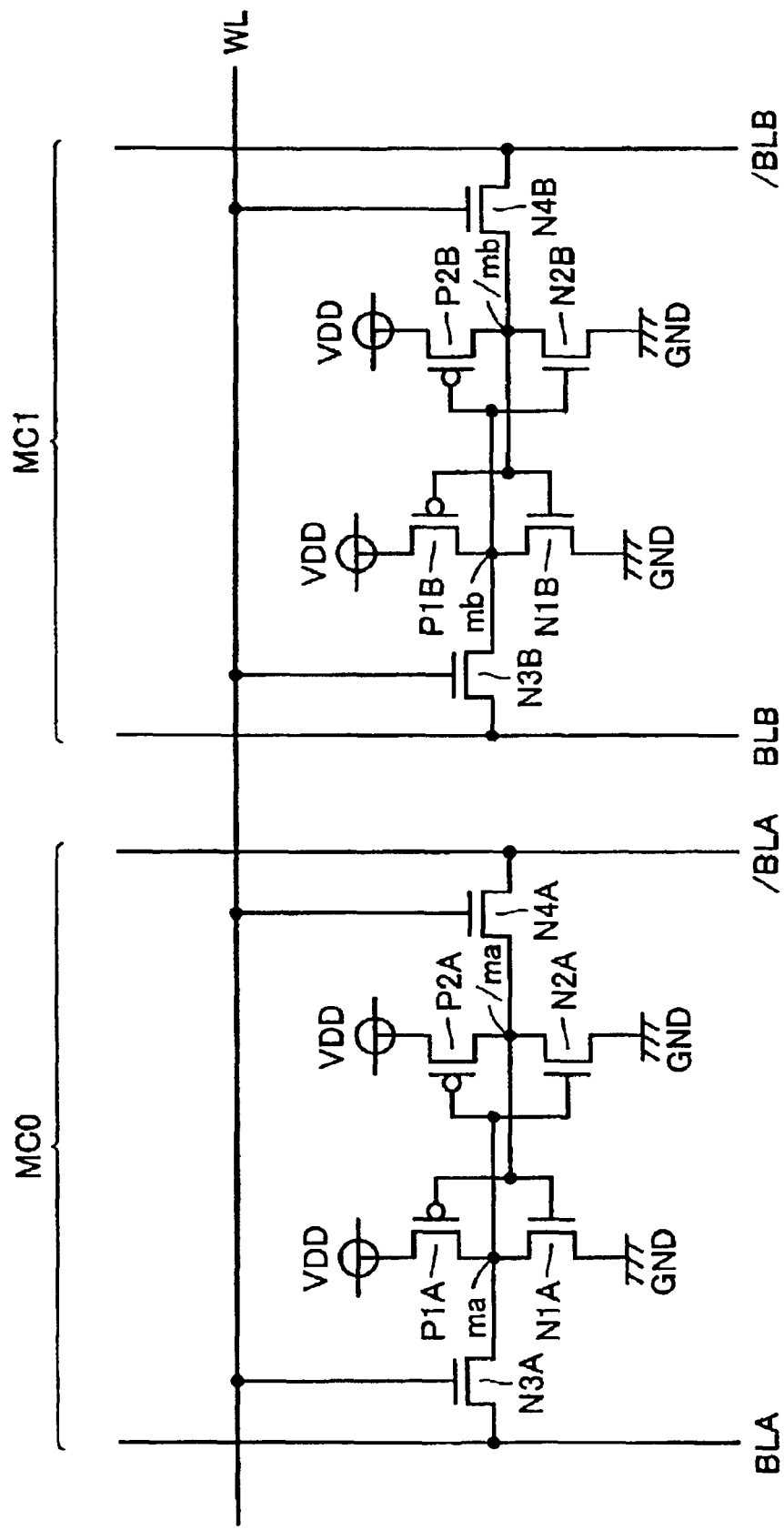
FIG. 14 is a diagram showing an equivalent circuit of two-bit memory cells arranged adjacent to each other in the row direction in an SRAM memory cell according to a prior art.
Figure 15:
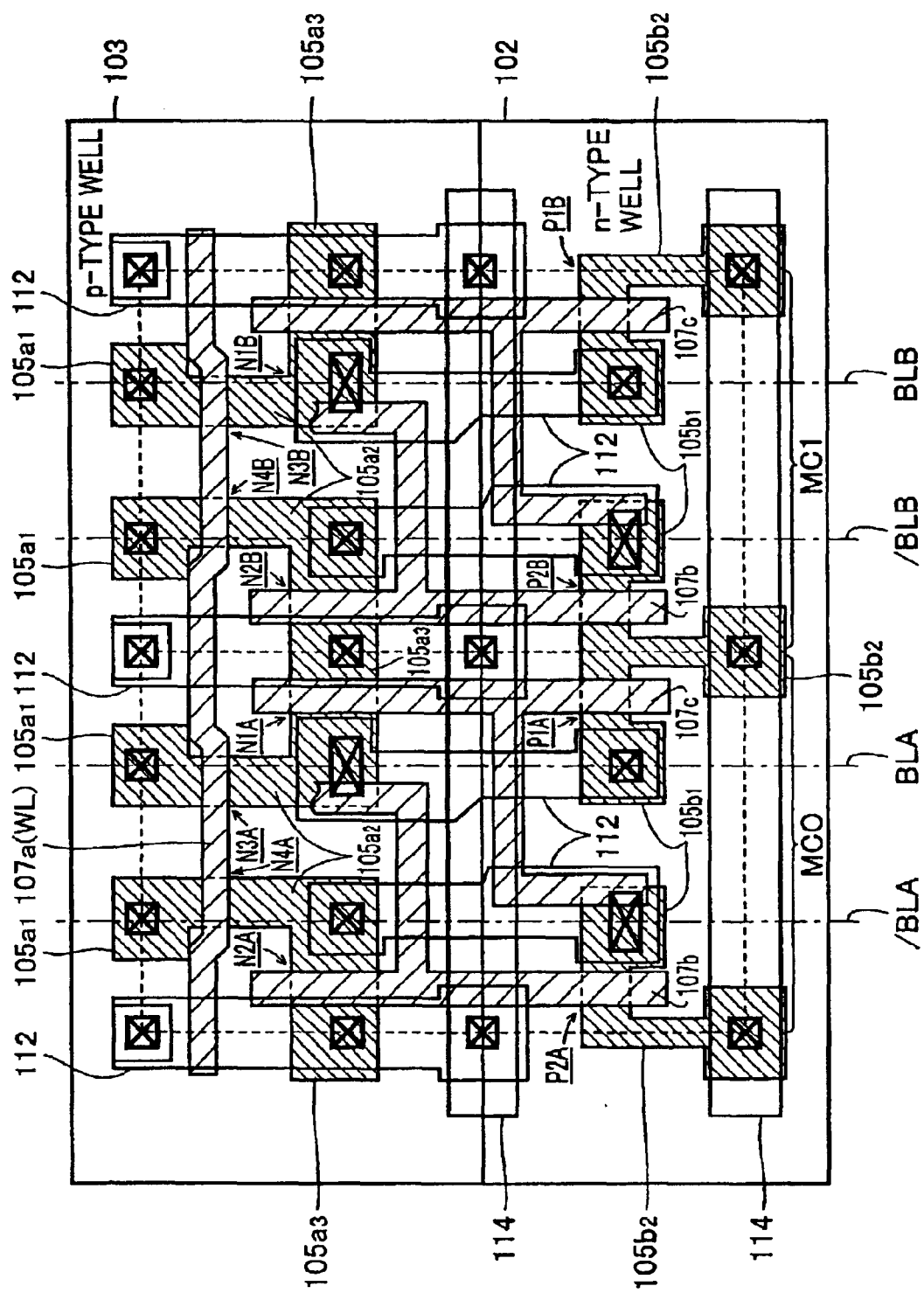
FIG. 15 is a schematic plan view showing a plan layout configuration of the SRAM memory cell according to the prior art.

It is noted that the other parts of the configuration of the equivalent circuit are approximately the same as those of the configuration of the equivalent circuit shown in FIG. 14 and, therefore, the same symbols are attached to the same elements, of which the descriptions will not be repeated.

In reference to FIGS. 2 to 5, respective memory cells MC0 and MC1 are formed within an n-type well 2 and a p-type well 3. This n-type well 2 and p-type well 3 are formed in the surface of a semiconductor substrate 1, which is electrically isolated by means of a field oxide film 4.

Figure 4:
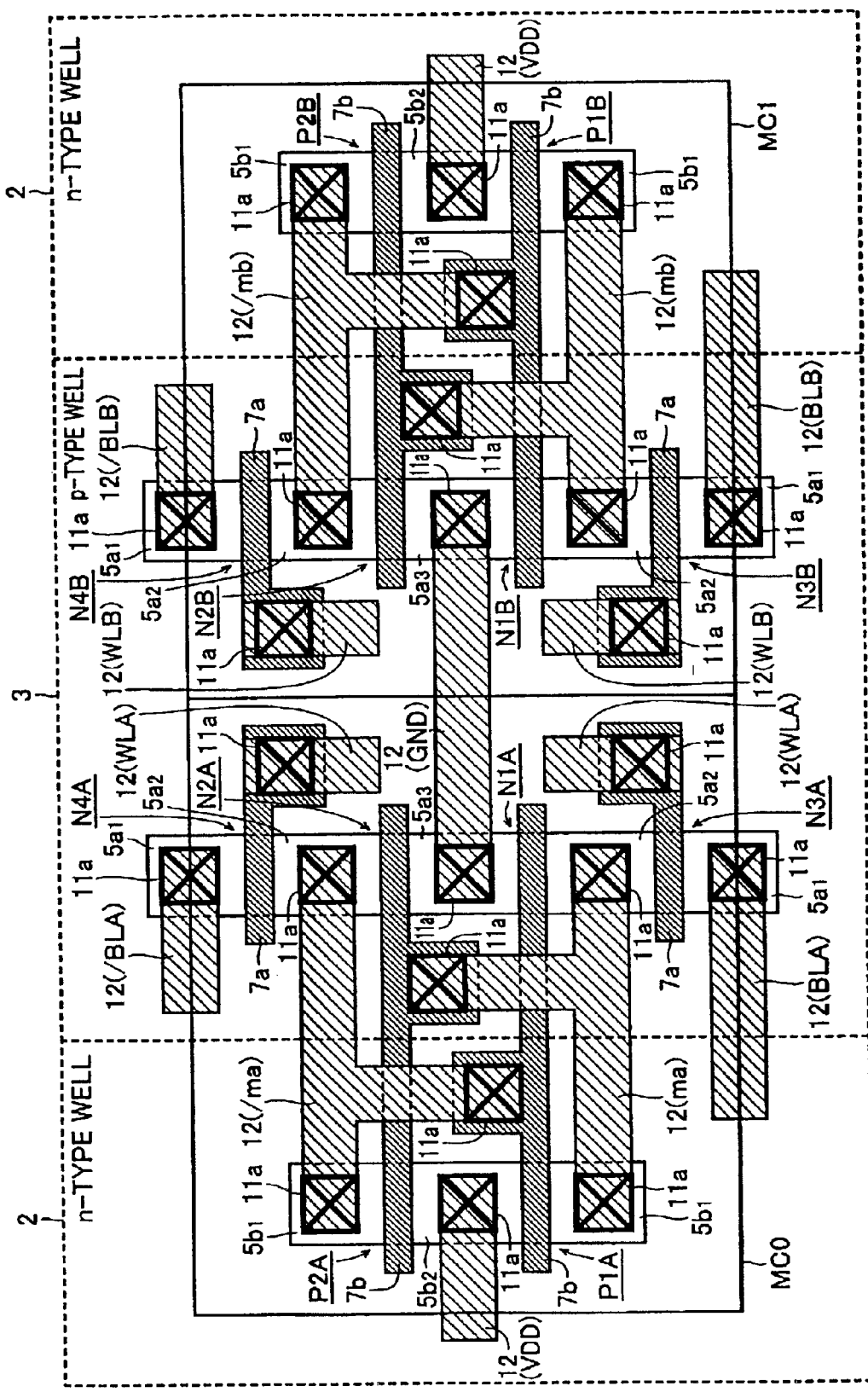
FIG. 4 is a schematic plan view showing a layout of a lower layer side of the layout of FIG. 2 divided in a layered direction.

In reference to FIG. 4, according to description of a memory cell MC0, two nMOS transistors N1A and N2A, serving as a pair of driver transistors, and two nMOS transistors N3A and N4A, serving as a pair of access transistors, are formed within p-type well 3. Two pMOS transistors P1A and P2A, serving as a pair of load transistors, are formed within n-type well 2.

Figure 3:
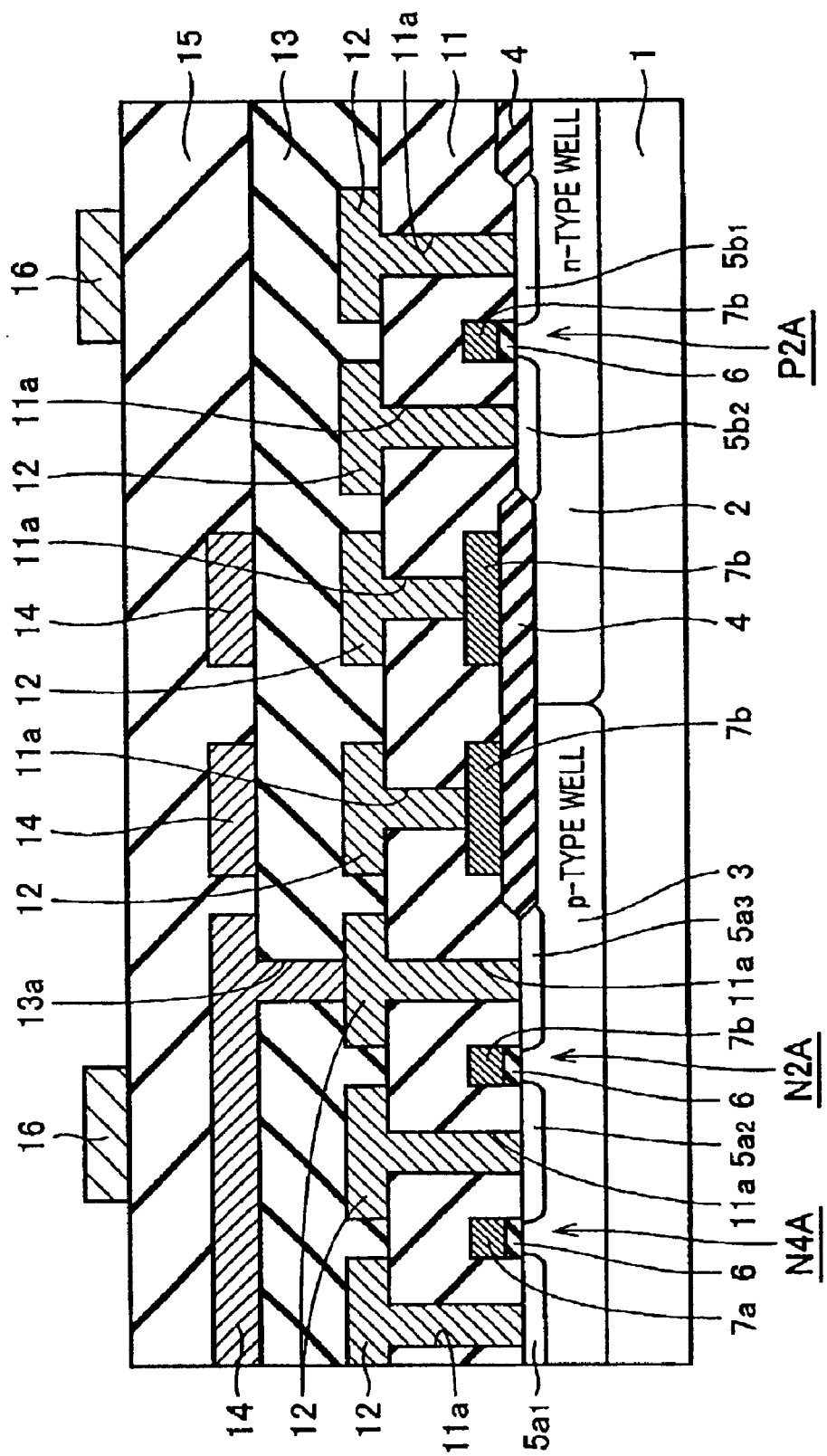
FIG. 3 is a schematic cross sectional view taken along a line III—III of FIG. 2.

Each of driver transistors N1A and N2A has a drain formed of an n-type impurity region $5a_2$, a source formed of an n-type impurity region $5a_3$ and a gate 7b extending onto the region between the drain and the source via a gate oxide film 6 (FIG. 3). Each of access transistors N3A and N4A has a drain formed of an n-type impurity region $5a_1$, a source formed of an n-type impurity region $5a_2$ and a gate 7a extending onto the region between the drain and the source via a gate oxide film 6 (FIG. 3).

Source $5a_2$ of access transistor N3A and drain $5a_2$ of driver transistor N1A are formed of a common n-type impurity region. In addition, source $5a_2$ and access transistor N4A and drain $5a_2$ of driver transistor N2A are formed of a common n-type impurity region. Source $5a_3$ of driver transistor N1A and source $5a_3$ of driver transistor N2A are formed of a common n-type impurity region. Respective gates 7a of access transistors N3A and N4A are formed of individual doped polycrystalline silicon layers (polycrystal silicon layers into which impurities are doped).

Each of load transistors P1A and P2A is constituted by a drain formed of a p-type impurity region $5b_1$, a source formed of a p-type impurity region $5b_2$ and a gate 7b extending onto the region between the drain and the source via a gate oxide film 6 (FIG. 3).

Gate 7b of load transistor P1A and gate 7b of driver transistor N1A are formed of a common doped polycrystalline silicon layer while gate 7b of load transistor P2A and gate 7b of driver transistor N2A are formed of a common doped polycrystalline silicon layer.

Source $5a_2$ of access transistor N3A, drain $5a_2$ of driver transistor N1A, drain $5b_1$ of load transistor P1A and respective gates 7b of load transistor P2A and driver transistor N2A are electrically connected to a first metal wire 12 via a contact hole 11a, respectively. Source $5a_2$ of access transistor N4A, drain $5a_2$ of driver transistor N2A, drain $5b_1$ of load transistor P2A and respective gates 7b of load transistor P1A and driver transistor N1A are electrically connected to a first metal wire 12 via a contact hole 11a, respectively.

Figure 5:
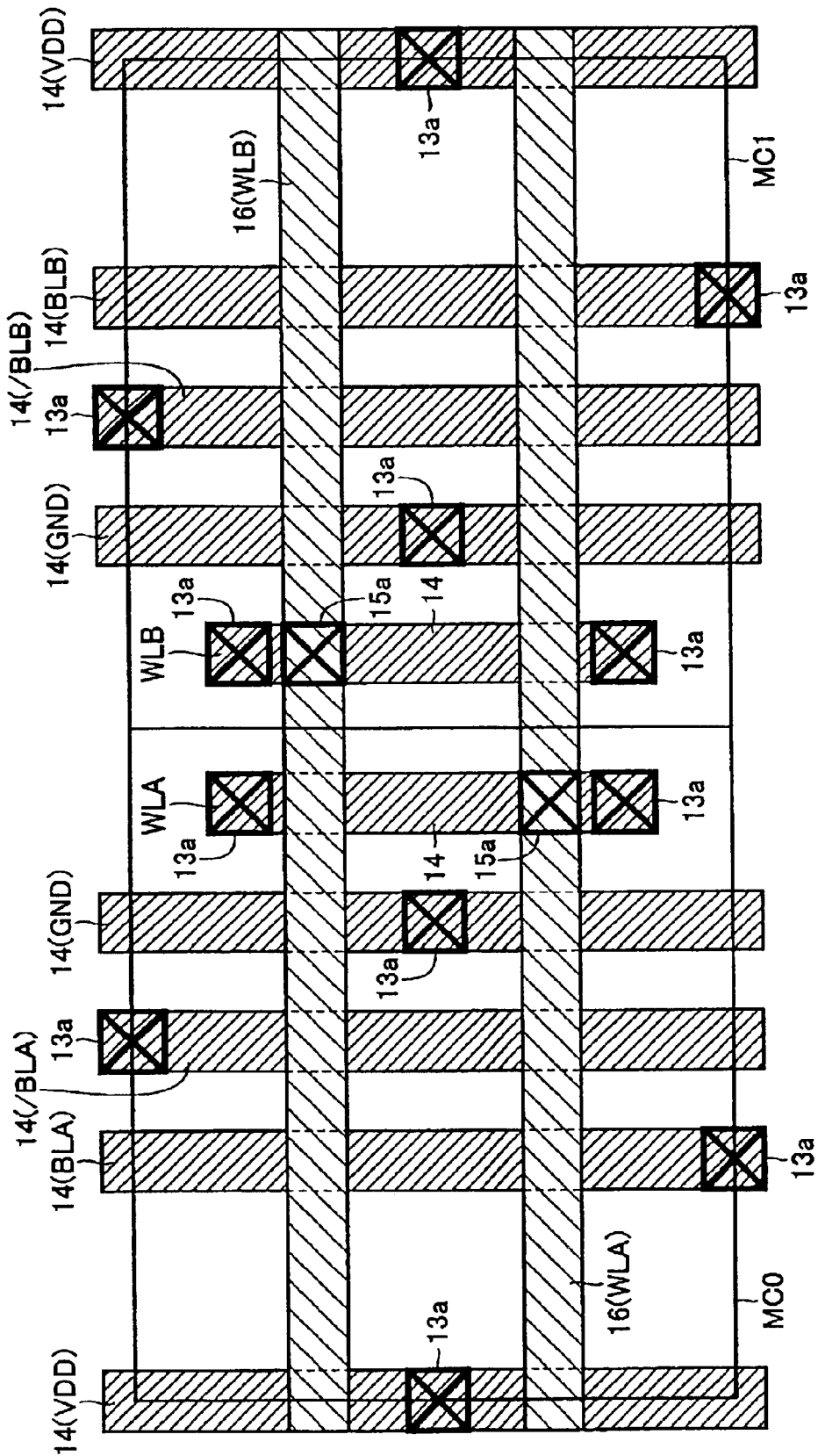
FIG. 5 is a schematic plan view showing a layout of an upper layer side of the layout of FIG. 2 divided in the layered direction.

In reference to FIGS. 4 and 5, first metal wire 12 is electrically connected to respective sources $5a_3$ of driver transistors N1A and N2A, and a second metal wire 14 which serves as a GND potential is electrically connected to this first metal wire 12 through a via hole 13a. In addition, first metal wire 12 is electrically connected to respective sources $5b_2$ of load transistors P1A and P2A, and a second metal wire 14 which serves as a VDD potential is electrically connected to this first metal wire 12 through a via hole 13a.

A first metal wire 12 is electrically connected to drain $5a_1$ of access transistor N3A via a contact hole 11a, and a second metal wire 14 which serves as a bit line BLA is electrically connected to this first metal wire 12 through a via hole 13a. A first metal wire 12 is electrically connected to drain $5a_1$ of access transistor N4A via a contact hole 11a and a second metal wire 14 which serves as a bit line/BLA is electrically connected to this first metal wire 12 through a via hole 13a.

Individual first metal wires 12 are electrically connected to respective gates 7a of access transistors N3A and N4A via contact holes 11a, and common second metal wire 14 is electrically connected to each of these individual first metal wires 12 through via holes 13a and, furthermore, a third metal wire 16 that becomes a word line WLA is electrically connected to this second metal wire 14 through a via hole 15a.

Memory cell MC1 has approximately the same configuration as that of the above described memory cell MC0. This memory cell MC1 has a layout having point-symmetry with memory cell MC0 with respect to the center point C (FIG. 2) located on the borderline between two memory cells MC0 and MC1.

Gates 7a of access transistors N3A and N3B of memory cell MC0 and gates 7a of access transistors N3A and N3B of memory cell MC1 are electrically connected to different word lines WLA and WLB.

Memory cells arranged adjacent to each other in the row direction are formed so as to share the common well region and memory cells MC0 and MC1 share p-type well 3. In addition, though not shown in FIG. 2, the memory cell arranged adjacent to memory cell MC0 on the left and memory cell MC0 share n-type well 2 while the memory cell arranged adjacent to memory cell MC1 on the right and memory cell MC1 share n-type well 2.

It is noted that n-type well 2 and p-type well 3 extend in the column direction and are distributed across a plurality of columns.

In the present embodiment, n-type well 2 and p-type well 3 are shared between memory cells arranged adjacent to each other in the same manner as in the conventional layout configuration. As miniaturization progresses, the distance between respective bits is reduced so that electron hole pairs generated within a well due to a rays or neutron rays are collected in impurity regions of a plurality of adjoining bit cells, thereby the possibility of simultaneously causing errors increases. In particular, electrons have a higher mobility in comparison with holes and, therefore, exert a greater influence than do holes.

In the present embodiment, n-type impurity regions forming the respective storage nodes of memory cells MC0 and MC1 are formed within the same p-type well 3 and arranged in proximity to each other. However, respective memory cells MC0 and MC1 are made to have separate word lines, respectively, thereby memory cells MC0 and MC1 are not simultaneously accessed. Thus, the problem of generation of a multi-bit error, which becomes a fatal error for the entirety of the system, can be avoided.

Second Embodiment

Figure 1:
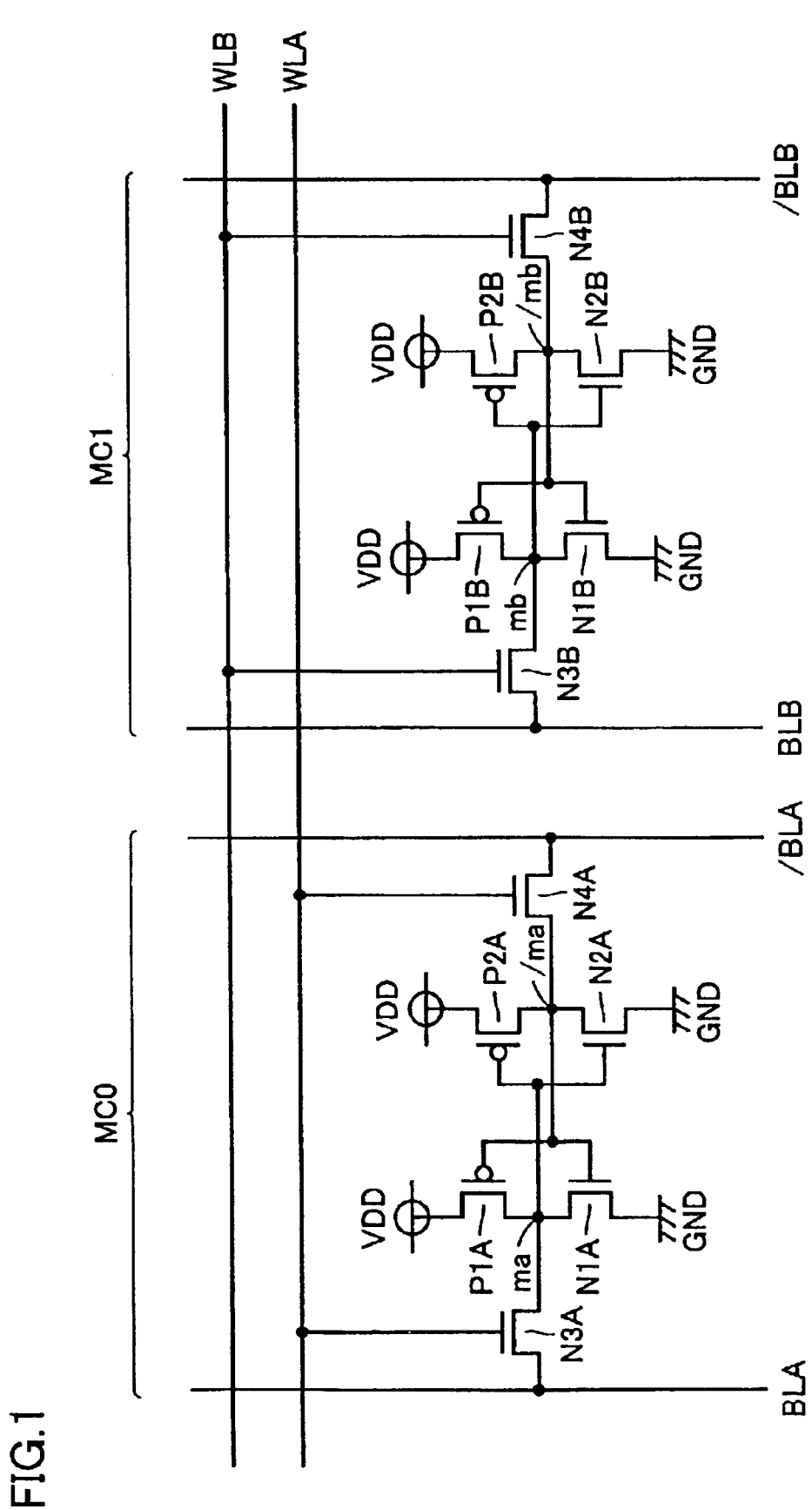
FIG. 1 is a diagram showing an equivalent circuit of two-bit memory cells arranged adjacent to each other in a row direction in an SRAM memory cell according to a first embodiment of the present invention.
Figure 2:
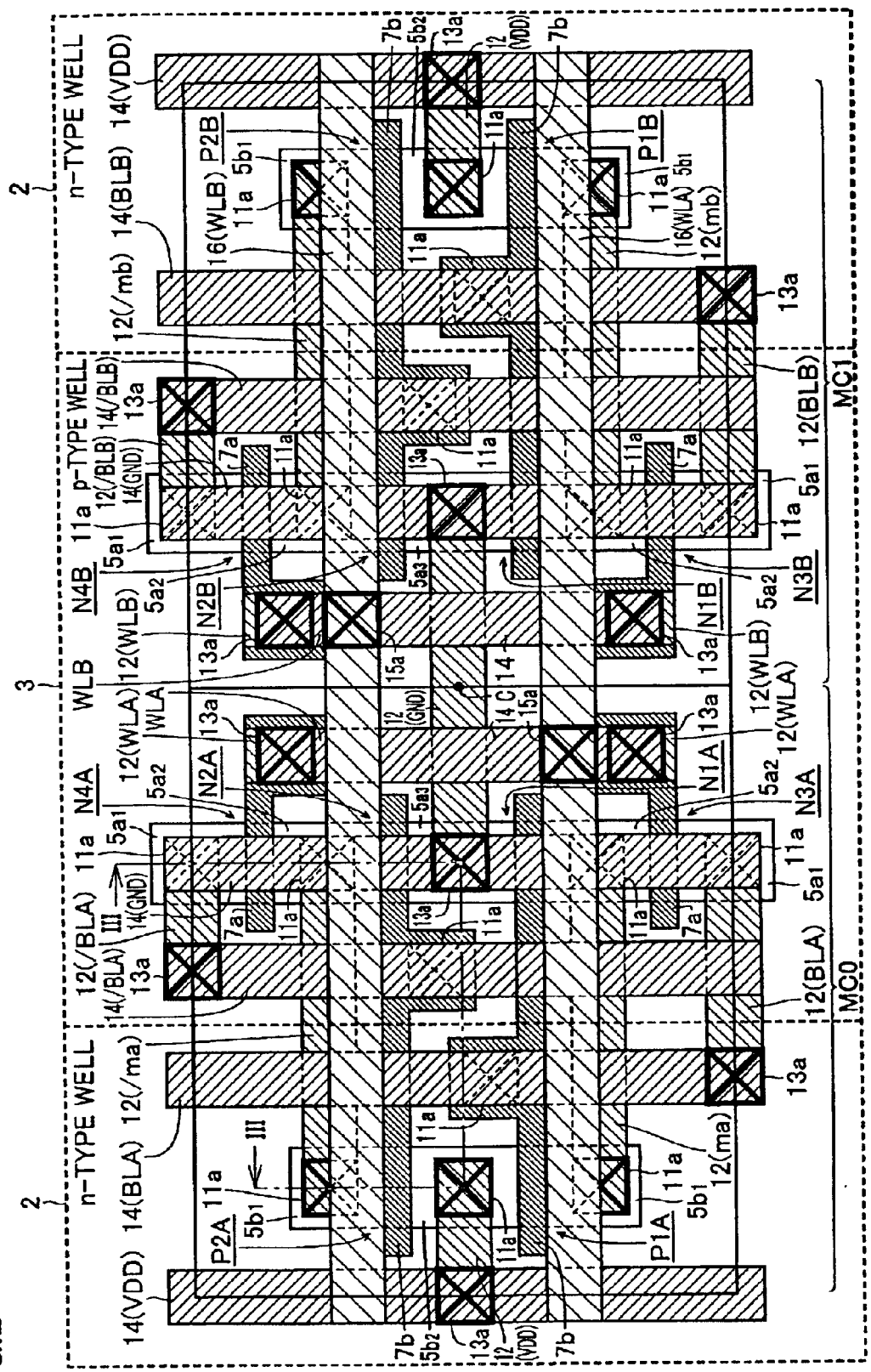
FIG. 2 is a schematic plan view showing a layout configuration of two-bit memory cells arranged adjacent to each other in the row direction in the SRAM memory cell according to the first embodiment of the present invention.
Figure 6:
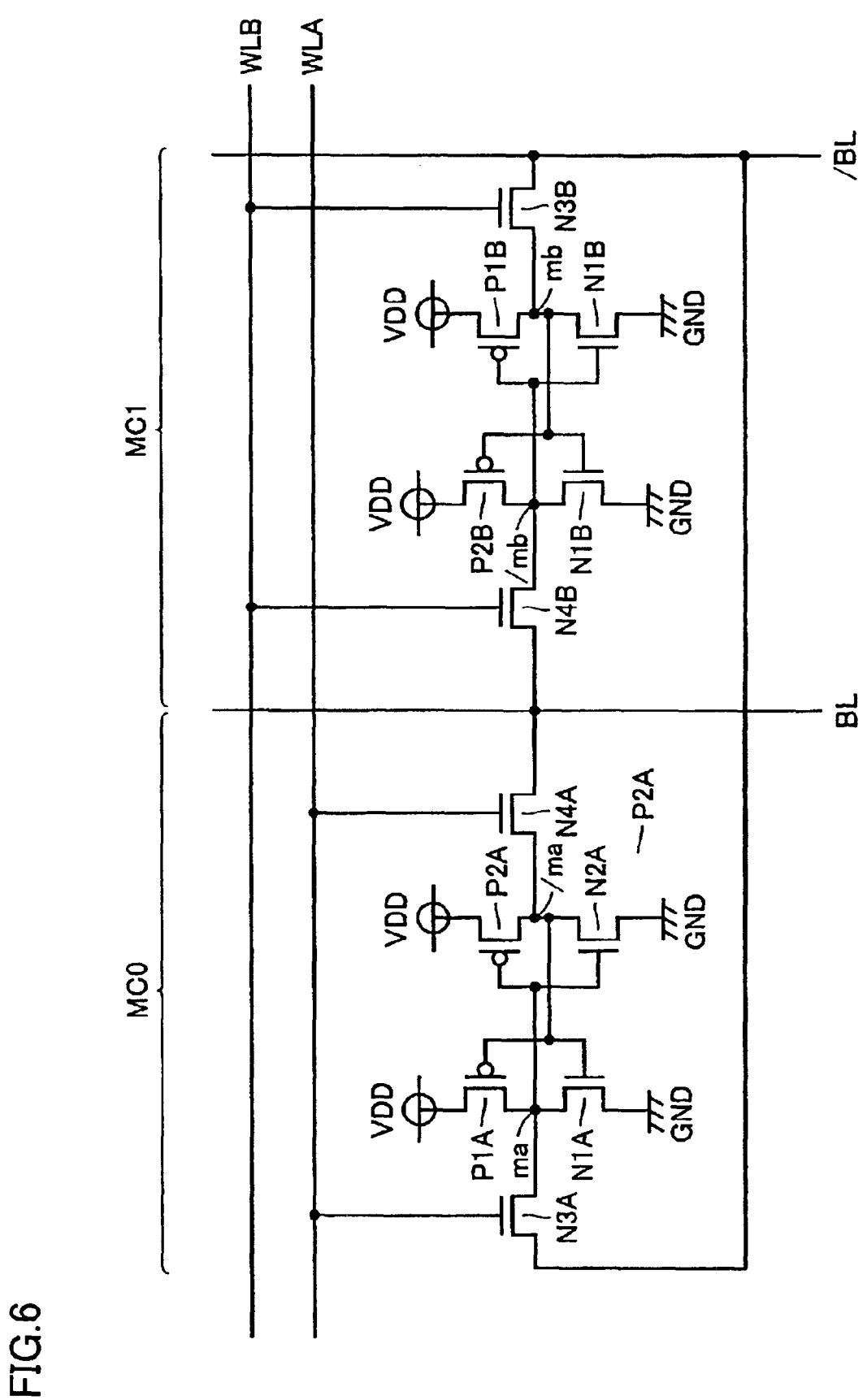
FIG. 6 is a diagram showing an equivalent circuit of two-bit memory cells arranged adjacent to each other in the row direction in an SRAM memory cell according to a second embodiment of the present invention.
Figure 7:
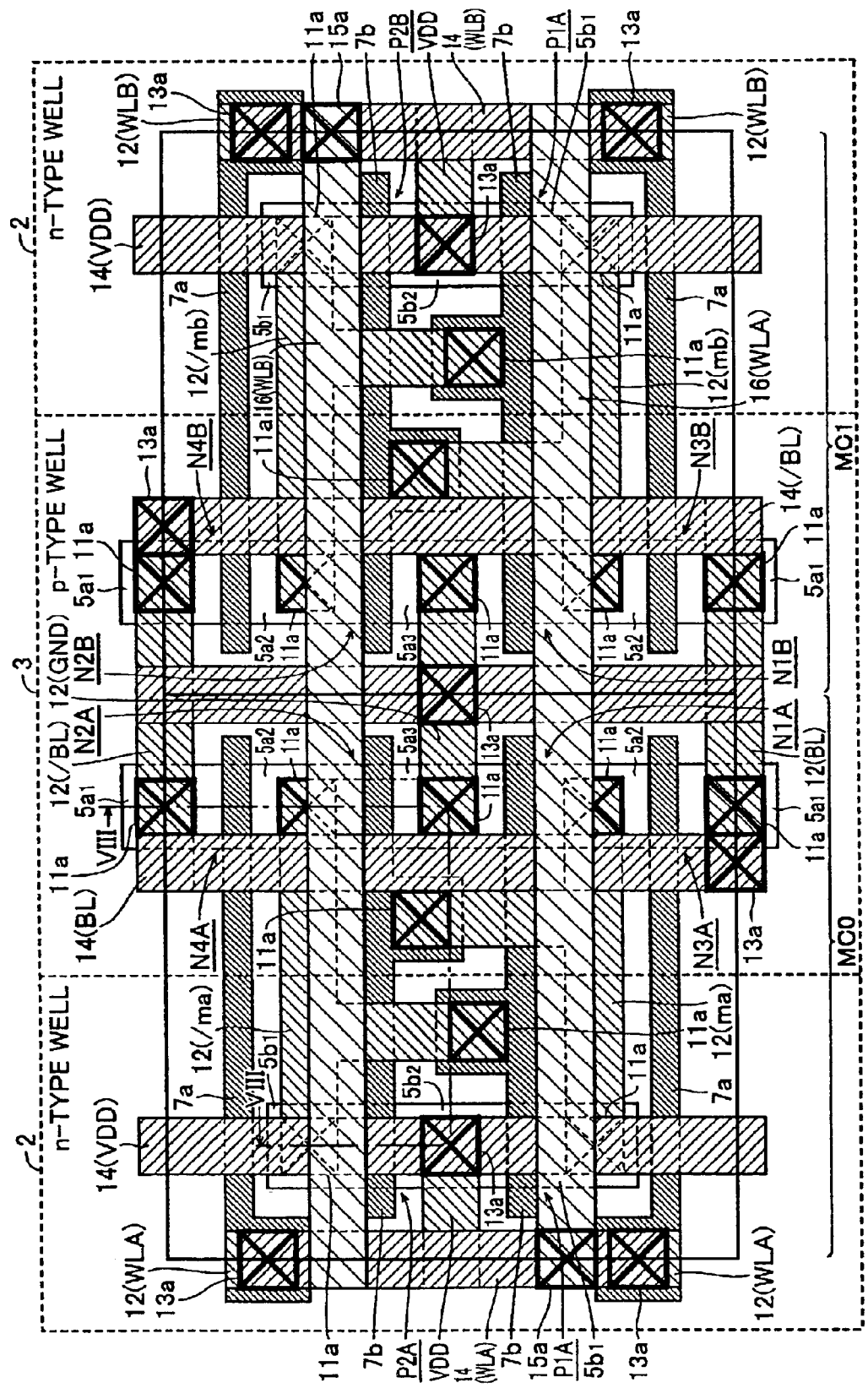
FIG. 7 is a schematic plan view showing a layout configuration of two-bit memory cells arranged adjacent to each other in the row direction in the SRAM memory cell according to the second embodiment of the present invention.

In reference to FIG. 6, the configuration of an equivalent circuit of the present embodiment differs from the configuration of the first embodiment shown in FIG. 1 in the point that a bit line pair BL and /BL of adjoining memory cells MC0 and MC1 are connected in common in the present embodiment.

Here, the other parts of the configuration of the equivalent circuit are approximately the same as of the above described configuration of the first embodiment and, therefore, the same symbols are attached to the same elements, of which the descriptions will not be repeated.

In the present embodiment, since word lines WLA and WLB are not simultaneously accessed, it is understood that there are no problems even in the case that the bit lines are connected in common between memory cells adjoined in the row direction. That is to say, in the case that word line WLA is selected and is risen, each of the internal storage nodes ma and /ma of memory cell MC0 is connected to each member of bit line pair BL and /BL, so that reading or writing of data is carried out. On the other hand, in the case that word line WLB is selected and is risen, each of the internal storage nodes mb and /mb of memory cell MC1 is connected to each member of bit line pair BL and /BL, so that reading or writing of data is carried out.

In reference to FIGS. 7 to 10, the configuration of the present embodiment mainly differs from the configuration of the first embodiment in the form of gate 7a of each access transistor and in the form of first metal wire 12 connected to drain $5a_1$ of each access transistor.

Figure 11:
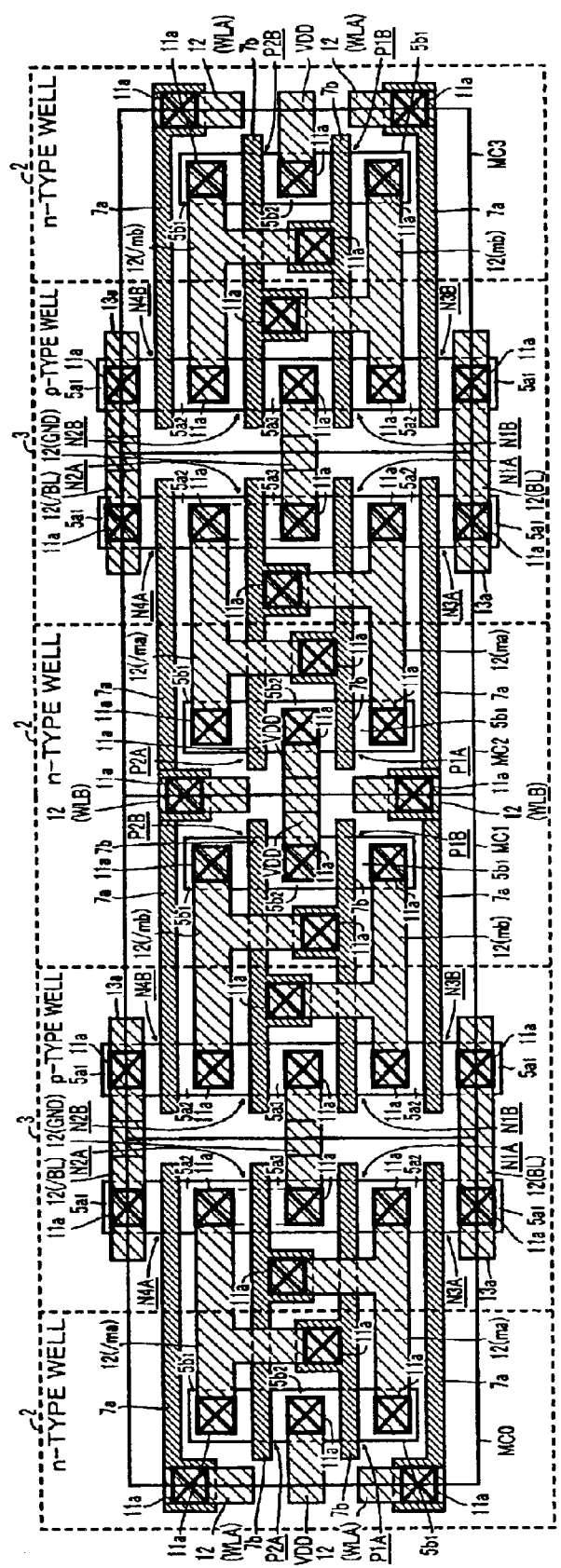
FIG. 11 is a schematic plan view showing a layout configuration of four-bit memory cells arranged adjacent to each other in the row direction of the SRAM memory cell according to the second embodiment of the present invention.

Gate 7a of each access transistor extends from within p-type well 3 to within n-type well 2. Thereby, as shown in FIG. 11, it becomes possible to form gates 7a of the access transistors of a single doped polycrystalline silicon layer in memory cells (for example, MC1 and MC2) arranged adjacent to each other with n-type well 2 located therebetween. Therefore, the respective gates of four access transistors of memory cells MC1 and MC2 adjoining each other with n-type well 2 located therebetween can be electrically connected to third metal wire 16 made of a single word line.

In addition, respective drains $5a_1$ of access transistors N3A and N3B of memory cells MC0 and MC1 arranged adjacent to each other with p-type well 3 located therebetween are electrically connected to first metal wire 12. In addition, respective drains $5a_1$ of access transistors N4A and N4B of memory cells MC0 and MC1 arranged adjacent to each other with p-type well 3 located therebetween are also electrically connected to first metal wire 12. Thereby, bit line pairs BL and /BL of memory cells MC0 and MC1 arranged adjacent to each other in the row direction can be shared.

In addition, respective sources $5a_3$ of the respective driver transistors of memory cells MC0 and MC1 arranged adjacent to each other in the row direction can be electrically connected to the single second metal wire 14 (GND).

Here, the other parts of the configuration are approximately the same as of the above described layout configuration of the first embodiment and, therefore, the same symbols are attached to the same members, of which the descriptions will not be repeated.

Though it is necessary to broaden the lateral width of a memory cell per one bit in order to split the word line in the first embodiment, it is not necessary to split the word line in the present layout configuration and, therefore, the layout size can be reduced in comparison with the first embodiment so that it becomes possible to reduce the scale of the layout area by forming the layout as described above.

In addition, the number of bit line wires can be reduced by sharing bit lines of arranged adjacent to memory cells with n-type well 2 located in between. Thereby, the wiring intervals can be widened so that the coupling capacitance can be reduced and, therefore, an increase in speed and a reduction in power consumed can be achieved. In addition, the probability of the occurrence of defects due to foreign substances or the like can be reduced by having wider wiring intervals and, therefore, there is the advantage of a result of an increase in yield. The number of contacts for connecting the gates of the access transistors and the word lines can be reduced according to the same structure in comparison with the first embodiment, and therefore, the possibility of the occurrence of defects due to poor contact connections can be reduced so that an increase in yield can be expected.

In addition, the memory cells arranged adjacent to each other with a p-type well 3 located therebetween cannot be simultaneously accessed by separating the word lines for respective memory cells MC0 and MC1 in the same manner as in the first embodiment and, therefore, the problem of the generation of a multi-bit error, which becomes an error critical for the entirety of the system, can be avoided.

Figure 8:
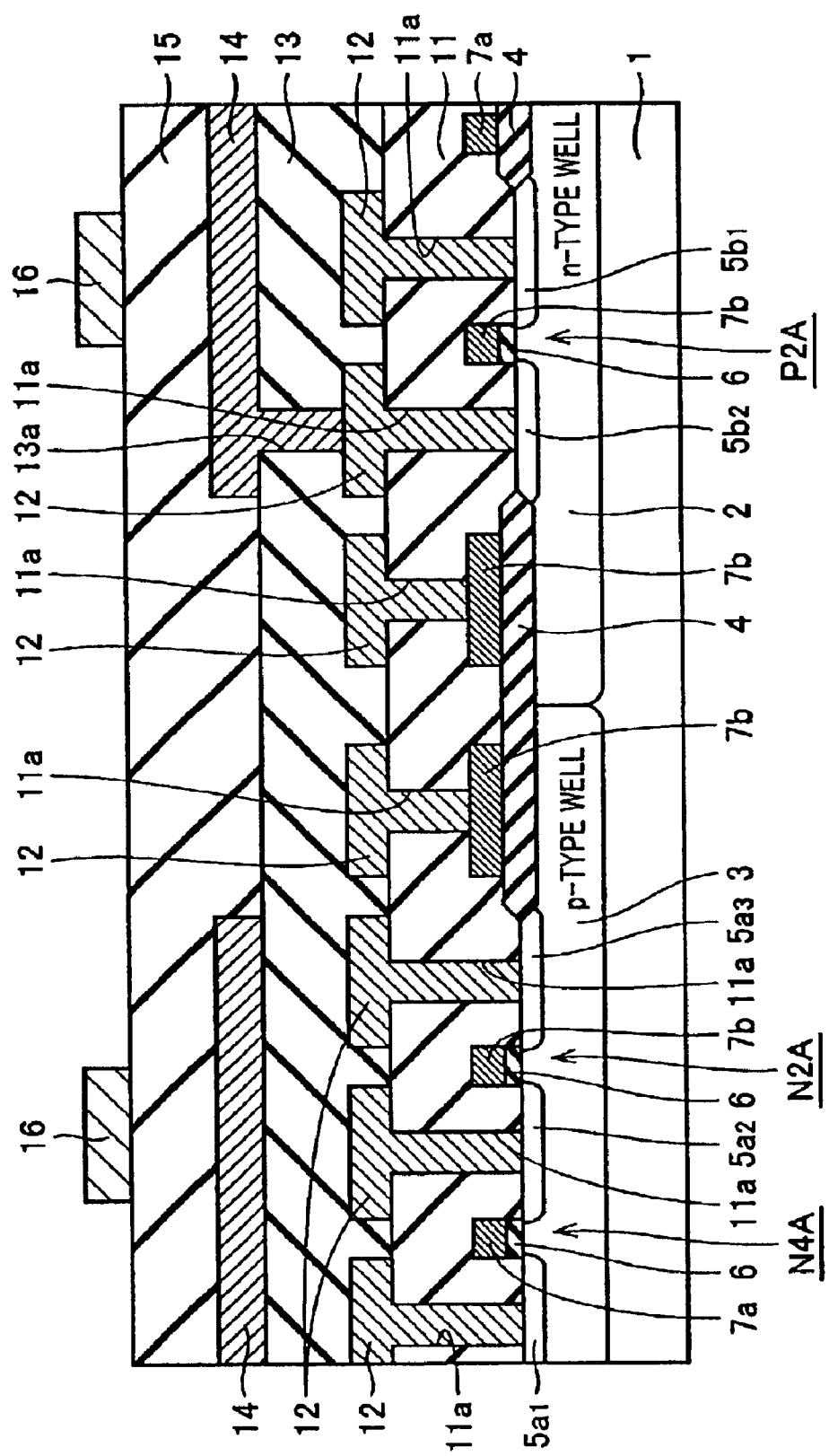
FIG. 8 is a schematic cross sectional view taken along a line VIII—VIII of FIG. 7.
Figure 9:
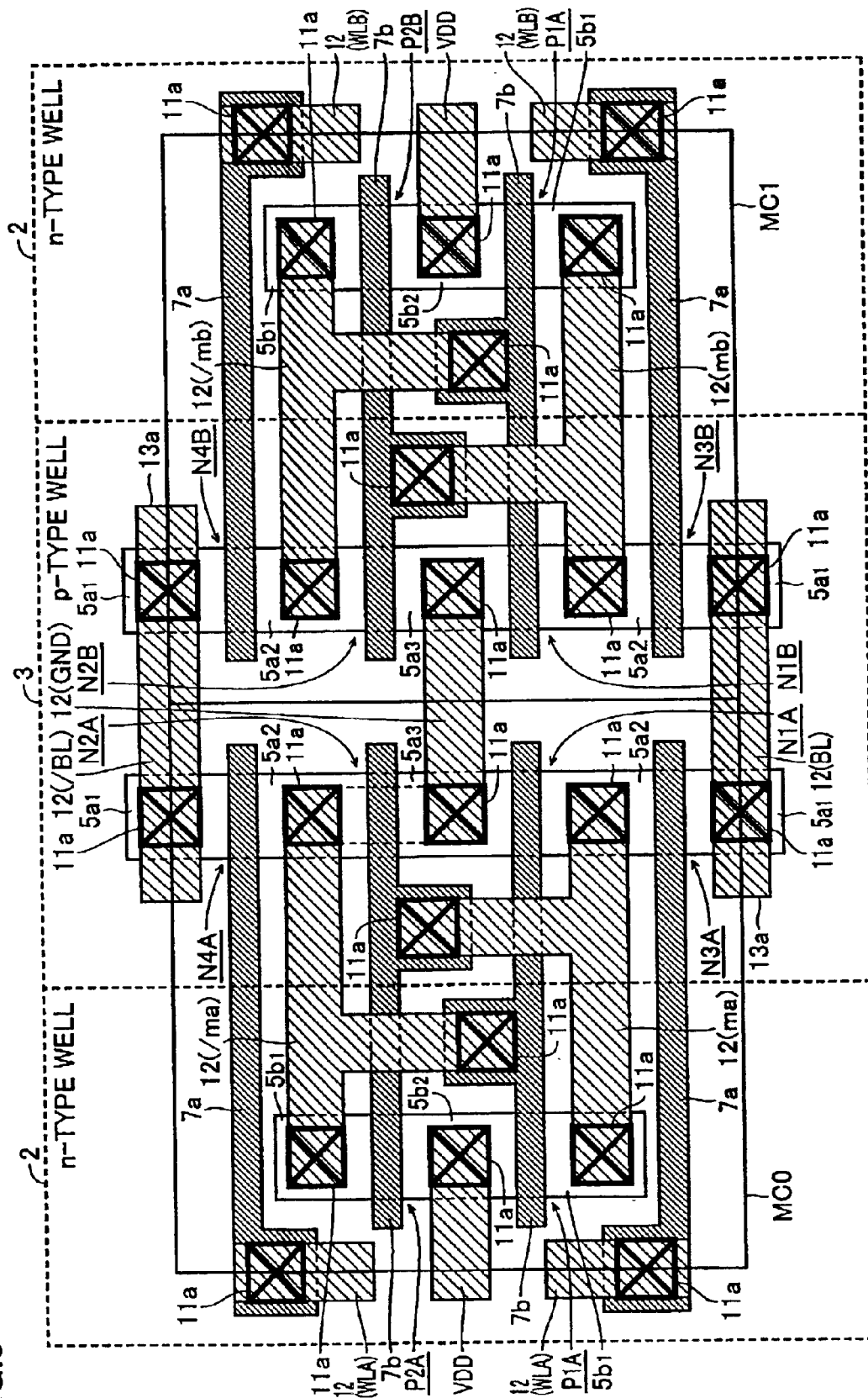
FIG. 9 is a schematic plan view showing a layout of a lower layer side of the layout of FIG. 7 divided in the layered direction.
Figure 10:
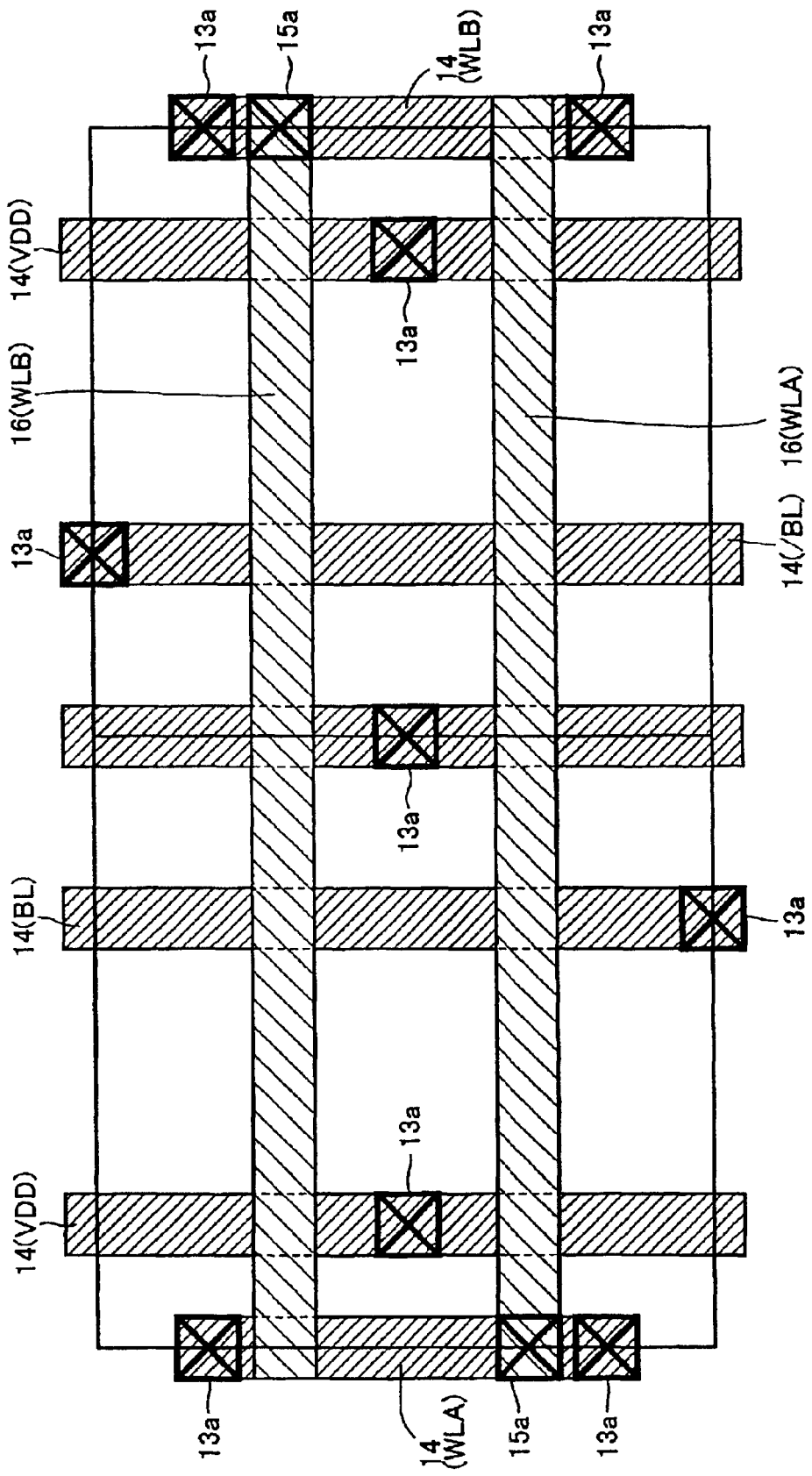
FIG. 10 is a schematic plan view showing a layout of a upper layer side of the layout of FIG. 7 divided in the layered direction.
Figure 12:
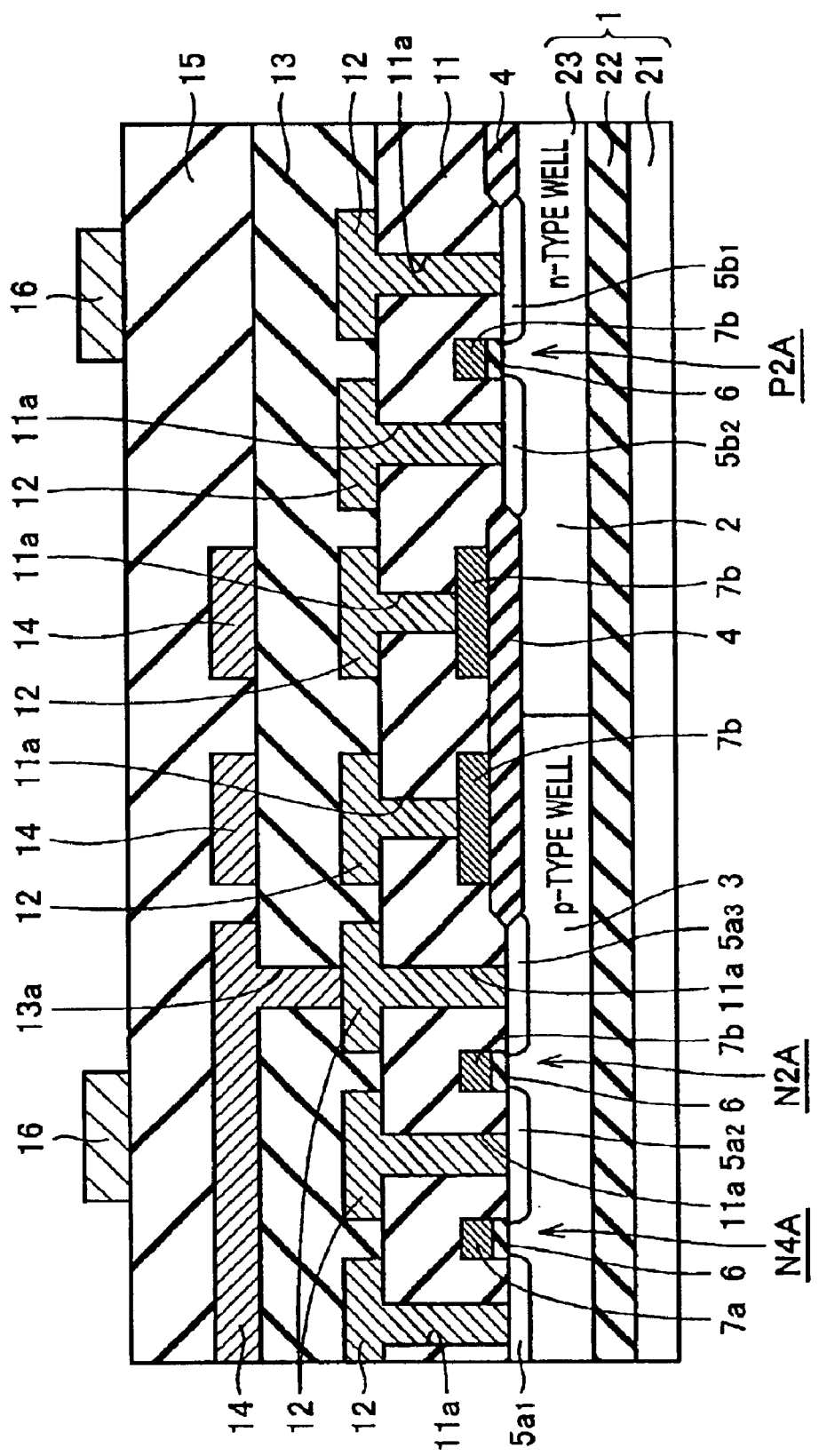
FIG. 12 is a schematic cross sectional view showing a configuration that an SOI substrate is used for the substrate in a configuration of an SRAM memory cell according to the first embodiment of the present invention.
Figure 13:
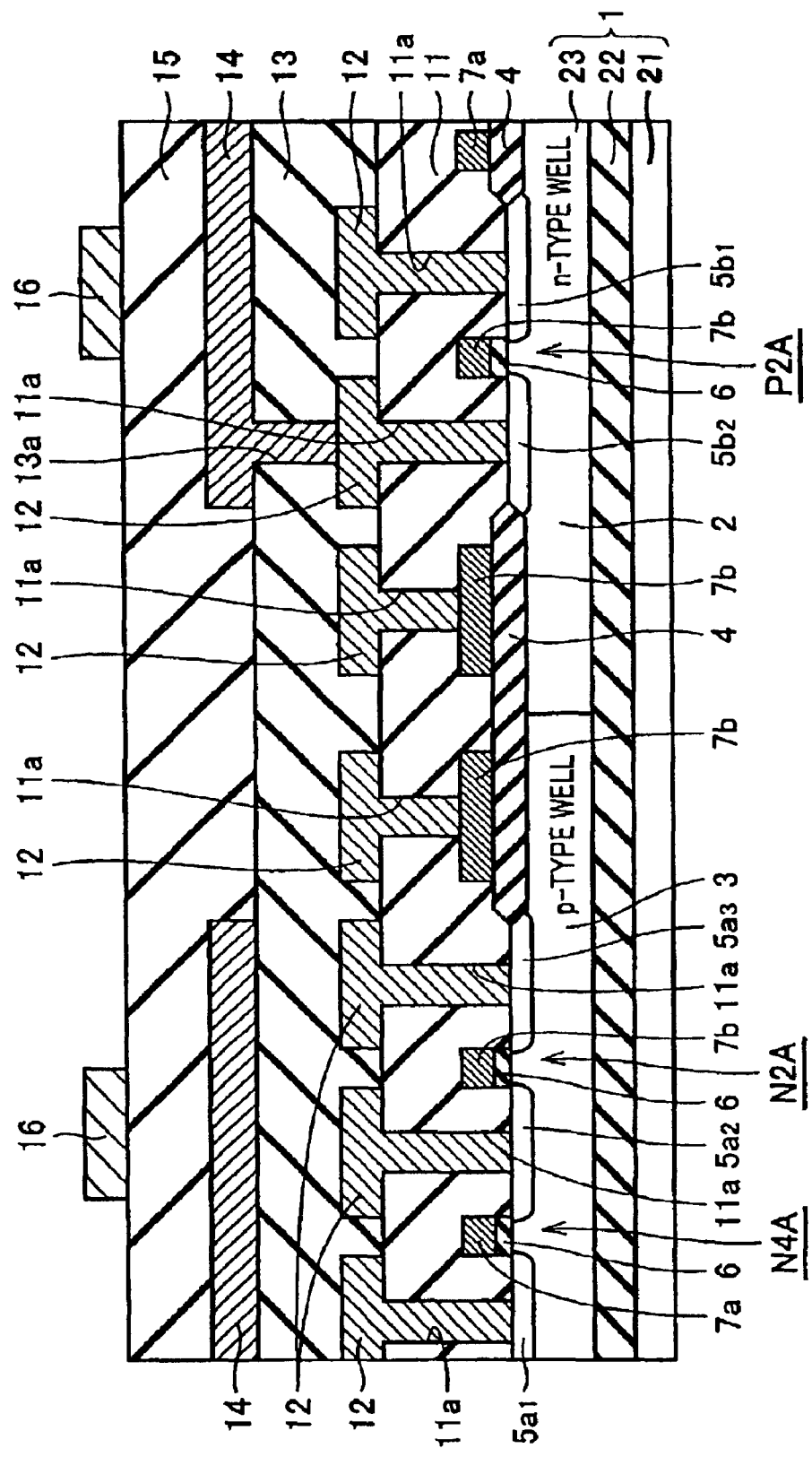
FIG. 13 is a schematic cross sectional view showing a configuration that an SOI substrate is used for the substrate in a configuration of an SRAM memory cell according to the second embodiment of the present invention.

It is noted that though in the configurations shown in FIG. 3 and FIG. 8 a case is described wherein semiconductor substrate 1 made of, for example, silicon is used, semiconductor substrate 1 may be an SOI substrate wherein an insulating layer 22 and a semiconductor layer 23 are layered on a substrate 21, as shown in FIGS. 12 and 13. In this case, n-type well 2 and p-type well 3 are formed in semiconductor layer 23 made of silicon.

In addition, though cases are described wherein six MOS transistors are used to form a memory cell of an SRAM, MIS (Metal Insulator Semiconductor) transistors may be used.

As described above, in the above semiconductor memory device the plurality of memory cells arranged so as to be aligned in the same row is preferably arranged so as to be aligned in the same row as that of the first and second memory cells and has a third memory cell mutually arranged adjacent to the first memory cell. Each of the first and third memory cells has first and second load transistors. The first and second load transistors of the first memory cell and the first and second load transistors of the third memory cell are formed within the same second conductive type region. Thus, the two bits arranged adjacent to each other can share the second conductive type region.

In the above described semiconductor memory device, the third memory cell preferably has first and second access transistors. The respective gates of the first access transistor of the first memory cell and of the first access transistor of the third memory cell are formed of a common first conductive layer while the respective gates of the second access transistor of the first memory cell and of the second access transistor of the third memory cell are formed of a common second conductive layer. The respective word lines are shared so that an increase in area can be restricted and, therefore, a memory cell of a higher integrity can be obtained. In addition, the number of contacts connected to the word lines can be reduced and, therefore, the probability of the occurrence of the lowering of the yield due to poor contact connection or the like can also be reduced.

In the above described semiconductor memory device each of the first and second conductive layers preferably has a polycrystal silicon into which impurities are doped. Thus, the respective word lines can be shared using polycrystalline silicon into which impurities are doped.

In the above described semiconductor memory device the respective drains of the first access transistor of the first memory cell and of the first access transistor of the second memory cell are electrically connected to the common first bit line while the respective drains of the second access transistor of the first memory cell and of the second access transistor of the second memory cell are electrically connected to the common second bit line. Thereby, bit lines are shared between two bits adjoining each other and, therefore, the number of bit lines can be reduced. Therefore, the intervals between bit lines can be widened so that the coupling capacitance can be reduced, an increase in the speed of access time and a reduction in the power consumed can be achieved and yield can be increased.

In the above described semiconductor memory device the semiconductor substrate preferably has a configuration wherein a substrate, an insulating layer and a semiconductor layer are sequentially layered and a region of a first conductive type and a region of a second conductive type are formed in the main surface of this semiconductor layer. The configuration of the present invention can be applied to such an SOI (Silicon On Insulator) substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device which has a memory cell array including a plurality of memory cells arranged in a row direction and in a column direction, comprising:
   a semiconductor substrate which has a main surface;
   a first conductive type region and a second conductive type region each of which extends in the column direction while arranged adjacent to each other in the main surface of said semiconductor substrate; and
   first and second word lines which are arranged in each of the plurality of rows, wherein
   each of first and second memory cells arranged adjacent to each other among said plurality of memory cells arranged so as to be aligned in the same row has first and second access transistors,
   said first and second access transistors of said first memory cell and said first and second access transistors of said second memory cell are formed within said same first conductive type region, and
   each gate of said first and second access transistors of said first memory cell is electrically connected to said first word line and each gate of said first and second access transistors of said second memory cell is electrically connected to said second word line.

2. The semiconductor memory device according to claim 1, wherein
   said plurality of memory cells arranged so as to be aligned in the same row has a third memory cell,
   said third memory cell is arranged so as to be aligned with said first and second memory cells in the same row, and arranged adjacent to said first memory cell each other,
   each of said first and third memory cells has first and second load transistors, and
   said first and second load transistors of said first memory cell and said first and second load transistors of said third memory cell are formed within said same second conductive type region.

3. The semiconductor memory device according to claim 2, wherein
   said third memory cell has first and second access transistors, and
   each gate of said first access transistor of said first memory cell and of said first access transistor of said third memory cell is formed of a common first conductive layer, and each gate of said second access transistor of said first memory cell and of said second access transistor of said third memory cell is formed of a common second conductive layer.

4. The semiconductor memory device according to claim 3, wherein
   each of said first and second conductive layers has a polycrystalline silicon into which impurities are doped.

5. The semiconductor memory device according to claim 1, wherein
   each drain of said first access transistor of said first memory cell and of said first access transistor of said second memory cell is electrically connected to a common first bit line, and each drain of said second access transistor of said first memory cell and of said second access transistor of said second memory cell is electrically connected to a common second bit line.

6. The semiconductor memory device according to claim 1, wherein
   said semiconductor substrate has a configuration that a substrate, an insulating layer and a semiconductor layer are sequentially laminated, and said first conductive type region and said second conductive type region are formed on a main surface of said semiconductor layer.

* * * * *

UNITED STATES PATENT AND TRADEMARK OFFICE
CERTIFICATE OF CORRECTION

PATENT NO. : 6,741,492 B2
DATED : May 25, 2004
INVENTOR(S) : Koji Nii

It is certified that error appears in the above-identified patent and that said Letters Patent is hereby corrected as shown below:

<u>Title page,</u>
Item [56], References Cited, FOREIGN PATENT DOCUMENTS, change
"JP     10-289854     10/1998" to -- JP     10-289584     10/1998 --.

Signed and Sealed this

Twenty-third Day of November, 2004

JON W. DUDAS
*Director of the United States Patent and Trademark Office*